US011823766B2

(12) United States Patent
Yadav et al.

(10) Patent No.: US 11,823,766 B2
(45) Date of Patent: Nov. 21, 2023

(54) MLM MAPPED NAND LATCH

(71) Applicant: Western Digital Technologies, Inc., San Jose, CA (US)

(72) Inventors: Akhilesh Yadav, Karnataka (IN); Eldhose Peter, Karnataka (IN); Rakesh Balakrishnan, Karnataka (IN)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 115 days.

(21) Appl. No.: 17/455,007

(22) Filed: Nov. 15, 2021

(65) Prior Publication Data

US 2023/0154504 A1  May 18, 2023

Related U.S. Application Data

(63) Continuation of application No. 17/525,700, filed on Nov. 12, 2021, now abandoned.

(51) Int. Cl.
| | |
|---|---|
| G06F 11/10 | (2006.01) |
| G11C 29/52 | (2006.01) |
| G06F 12/02 | (2006.01) |
| G06F 3/06 | (2006.01) |
| G11C 7/10 | (2006.01) |
| G11C 8/08 | (2006.01) |
| G06F 12/1045 | (2016.01) |

(Continued)

(52) U.S. Cl.
CPC .......... *G11C 7/106* (2013.01); *G06F 12/1054* (2013.01); *G06F 12/1063* (2013.01); *G06F 13/1605* (2013.01); *G11C 7/1039* (2013.01); *G11C 7/1087* (2013.01); *G11C 8/08* (2013.01); *H03K 19/018521* (2013.01); *G06F 2212/7201* (2013.01)

(58) Field of Classification Search
CPC ..... G11C 7/106; G11C 7/1039; G11C 7/1087; G11C 8/08; G06F 12/1054; G06F 12/1063; G06F 13/1605; G06F 2212/7201; H03K 19/018521
USPC ...................................................... 365/189.05
See application file for complete search history.

(56) References Cited

U.S. PATENT DOCUMENTS

| | | | |
|---|---|---|---|
| 7,463,521 B2 | 12/2008 | Li | |
| 7,633,800 B2 * | 12/2009 | Adusumilli | ......... G11C 29/846 |
| | | | 365/185.12 |
| 9,431,120 B1 | 8/2016 | Tuers et al. | |

(Continued)

*Primary Examiner* — Ly D Pham
(74) *Attorney, Agent, or Firm* — ARENTFOX SCHIFF LLP

(57) ABSTRACT

A storage device is provided that allows a controller to directly access bytes of data in data latches connected to memory, as opposed to through controller RAM. The storage device may include a memory, a plurality of data latches connected to the memory, and a controller coupled to each of the data latches. The controller is configured to access one or more bytes of decoded data in one or more of the data latches. For instance, the controller may provide a command including an address for data in the memory, and may process one or more bytes of the data in at least one of the data latches in response to the command. The controller may also store a mapping of addresses for each of the word lines, including the address provided in the command. As a result, operation latency may be reduced and controller RAM savings achieved.

19 Claims, 11 Drawing Sheets

(51) Int. Cl.
    *G06F 13/16*       (2006.01)
    *H03K 19/0185*    (2006.01)

(56) References Cited

U.S. PATENT DOCUMENTS

| | | |
|---|---|---|
| 10,481,816 B2 | 11/2019 | Shlick et al. |
| 10,573,360 B1* | 2/2020 | Ferreira .............. G11C 11/4076 |
| 10,642,513 B2 | 5/2020 | Marcu et al. |
| 10,825,526 B1 | 11/2020 | Li et al. |
| 2017/0322843 A1 | 11/2017 | Hsu et al. |
| 2018/0373590 A1* | 12/2018 | Higgins .............. G06F 12/0238 |
| 2020/0004445 A1* | 1/2020 | Benisty ................. G06F 3/0664 |
| 2020/0242045 A1* | 7/2020 | Ramamurthy ...... G06F 12/1009 |
| 2021/0200689 A1* | 7/2021 | Benisty ............... G06F 12/1433 |
| 2021/0303206 A1* | 9/2021 | Saxena ................... G06F 3/061 |
| 2022/0147440 A1* | 5/2022 | Benisty ............... G06F 12/0868 |
| 2022/0308787 A1* | 9/2022 | Yadav ................. G11C 11/5628 |

\* cited by examiner

MLM MAPPED NAND LATCH

CROSS-REFERENCE TO RELATED APPLICATION(S)

This application is a Continuation of U.S. application Ser. No. 17/525,700, entitled "MLM MAPPED NAND LATCH," filed on Nov. 12, 2021, which is expressly incorporated by reference herein in its entirety.

BACKGROUND

Field

This disclosure is generally related to electronic devices and more particularly to storage devices.

Introduction

Storage devices enable users to store and retrieve data. Examples of storage devices include non-volatile memory devices. A non-volatile memory generally retains data after a power cycle. An example of a non-volatile memory is a flash memory, which may include array(s) of NAND cells on one or more dies. Flash memory may be found in solid-state devices (SSDs), Secure Digital (SD) cards, and the like.

A flash storage device may store control information associated with data. For example, a flash storage device may maintain control tables that include a mapping of logical addresses to physical addresses. This control tables are used to track the physical location of logical sectors, or blocks, in the flash memory. The control tables are stored in the non-volatile memory to enable access to the stored data after a power cycle.

Flash storage devices include dies containing blocks of NAND cells at the mapped physical addresses of flash memory. Flash storage devices may also include data latches that temporarily store data read from or written to the flash memory. However, conventional flash storage devices may not allow a controller external to these dies to access these data latches directly. Instead, the controller is limited to accessing data transferred from these latches in controller RAM. For example, when performing a read, data stored in these latches may be toggled out of the die and over a flash bus to the controller, where the data is decoded (e.g., using a low density parity check (LDPC) decoder in the controller) and afterwards stored in controller RAM. The controller may then access the decoded data in the controller RAM for processing. However, this process may take significant time and controller RAM, since the controller may end up waiting for multiple pages of data to be transferred from latches to controller RAM before the controller can access the data to complete a read.

SUMMARY

One aspect of a storage device is disclosed herein. The storage device includes a memory, a plurality of data latches connected to the memory, and a controller coupled to each of the data latches. The controller is configured to access a byte of data in one or more of the data latches.

Another aspect of a storage device is disclosed herein. The storage device includes a memory, a plurality of data latches connected to the memory, and a controller coupled to each of the data latches. The controller is configured to access decoded data in one or more of the data latches.

A further aspect of a storage device is disclosed herein. The storage device includes a memory, a plurality of data latches connected to the memory, and a controller coupled to each of the data latches. The memory includes a plurality of blocks, where each of the blocks includes a plurality of word lines. The controller is configured to store a mapping of addresses for each of the word lines, to provide a command including one of the addresses for data in the memory, and to process a byte of the data in at least one of the data latches in response to the command.

It is understood that other aspects of the storage device will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present invention will now be presented in the detailed description by way of example, and not by way of limitation, with reference to the accompanying drawings, wherein.

DETAILED DESCRIPTION

Figure 1:
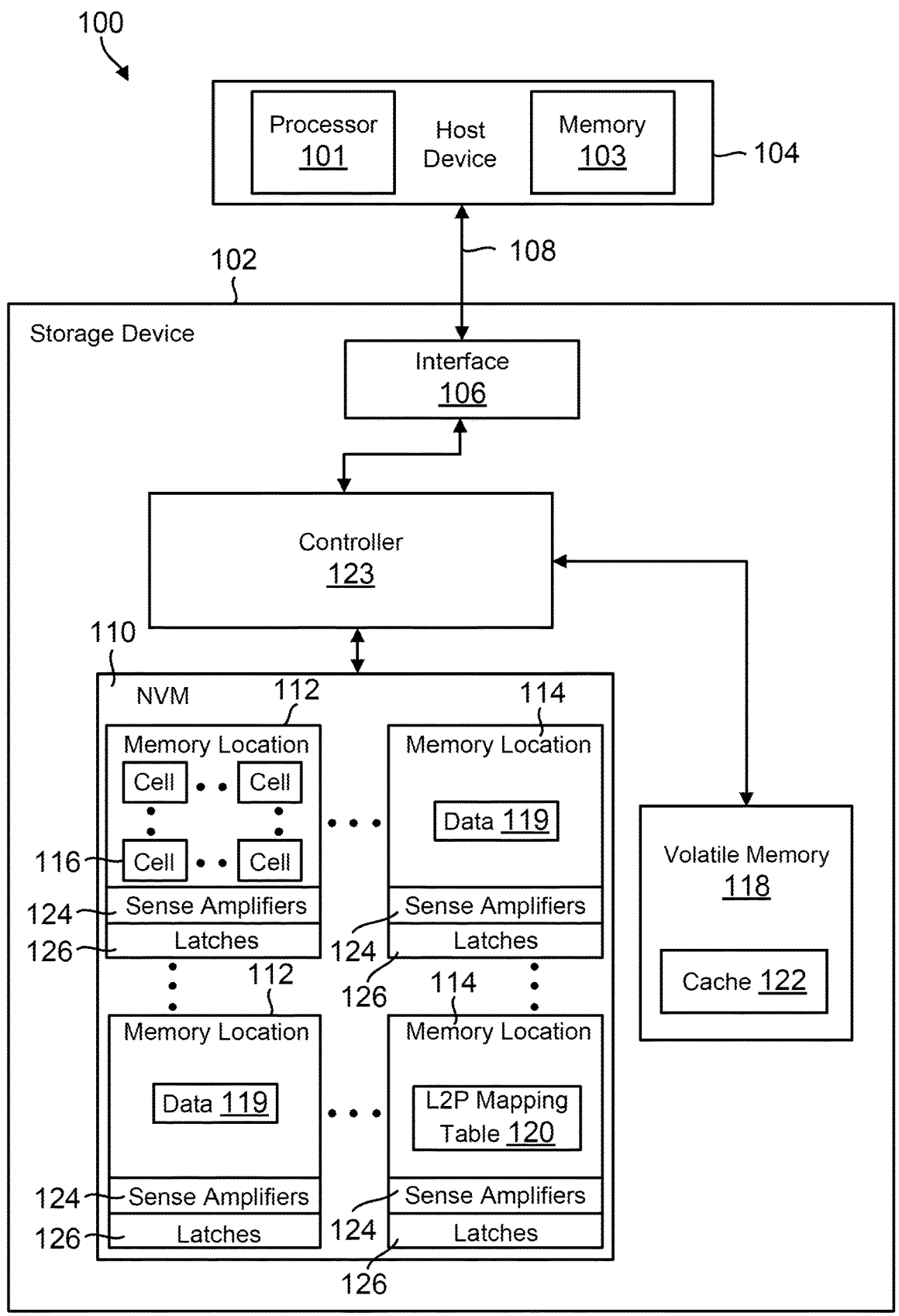
FIG. 1 is a block diagram illustrating an exemplary embodiment of a storage device in communication with a host device.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the invention include the described components, structure, features, functionality, processes, advantages, benefits, or modes of operation.

As used herein, the term "coupled" is used to indicate either a direct connection between two components or, where appropriate, an indirect connection to one another through intervening or intermediate components. In contrast, when a component referred to as being "directly coupled" to another component, there are no intervening elements present.

In the following detailed description, various aspects of a storage device in communication with a host device will be presented. These aspects are well suited for flash storage devices, such as SSDs and SD cards. However, those skilled in the art will realize that these aspects may be extended to all types of storage devices capable of storing data. Accordingly, any reference to a specific apparatus or method is intended only to illustrate the various aspects of the present invention, with the understanding that such aspects may have a wide range of applications without departing from the spirit and scope of the present disclosure.

Storage devices with NAND flash memory typically include CMOS logic under the array (CUA) of the flash memory. This CMOS logic may include sense amplifiers connected to memory cells as well as other control circuitry, which are physically located under the memory cells and under data latches connected to the memory cells. Generally, the data latches that are connected to memory cells in a particular die are only accessible by control circuitry within that same die, and a controller of the storage device may not itself directly access data in the data latches. Rather, the controller may instruct the CMOS logic to provide data from the data latches to controller RAM, and the controller is limited to accessing this data in the controller RAM.

Generally, the controller includes a processor and a flash interface module (FIM) (e.g., a component, circuit, or other module implemented in firmware/software, hardware, or a combination of firmware/software and hardware). The processor may provide descriptors or other information describing work to be performed in a NAND die (e.g., reads, writes, etc.), and the FIM may construct one or more NAND commands or sequences in response to the descriptors that cause the control circuitry in the NAND die to sense or program data in the data latches and to transfer data over a flash bus between the controller and the NAND die. Once the FIM receives the transferred data over the flash bus, the data is stored in controller RAM, and the processor may execute, update, or otherwise process the data in the controller RAM. The processor may also provide updated or new data from the controller RAM back to the FIM to be similarly transferred and written to the NAND die.

As a result, typical data reads, writes, relocations, or other operations involving data latches may take significant time and controller memory to process. For example, in order to conventionally relocate data from one NAND die to another NAND die, the controller may toggle the data from one die into controller RAM over the flash bus, and then transfer the data from the controller RAM back over the flash bus to another die to be programmed. Similarly, when performing a conventional data read or data write in NAND memory, the controller may toggle or transfer data between one or more NAND dies and internal controller RAM through the flash bus, after which the controller may access the data in the controller RAM for processing. This transfer of data between controller RAM and NAND dies may inefficiently increase operation latency. Moreover, the transferred data from the data latches to the controller RAM is typically encoded data, and thus this data is first decoded in the controller (e.g., by a LDPC decoder in the controller) prior to storage in controller RAM for processing, further increasing operation latency. Additionally, the storage of this data in controller RAM may quickly fill the memory and prevent its use for other purposes, as the amount of controller RAM is generally limited in low-cost storage devices.

Furthermore, flash memory firmware may store a significant amount of control information apart from host user data in NAND, including, for example, overlay codes, internal file system data, and entries in logical-to-physical (L2P) mapping tables. This control information is generally loaded in controller RAM in small pieces (e.g. in one or more bytes) or at regular intervals (e.g., every time that data in NAND is accessed, such as whenever data is being read or written), thereby incurring frequent overhead and reduction in performance. For example, overlay codes are temporary functions (e.g., executable codes spanning multiple bytes) which the controller may load in controller RAM (e.g., following a data sense and toggle out from NAND) for execution in order to conserve the limited RAM space. Since the controller does not have direct access to the NAND, these functions are generally individually read from NAND and transferred to controller RAM for processing, resulting in inefficient overhead and intelligent overlay grouping requirements in the NAND. Similarly, each time that internal file system data or L2P table entries are toggled out from NAND and transferred to controller RAM in the form of a complete page for processing, the controller may extract only a small number of bytes in each page for updating this data, further resulting in inefficient transfer overhead and reduced storage device performance.

To reduce such overhead and improve performance, the storage device of the present disclosure provides multi-level memory (MLM) mapped data latches that a controller may directly access for executing, loading, or storing data. In one example, a MLM system may include two or more types of memory or memory technologies, for example, in the case of a flash storage device, a controller including one type of memory (e.g., DRAM or SRAM) and peripherals (e.g., NAND packages or dies) including different type of memory (e.g., flash memory). Thus, a MLM-mapped data latch may refer to a data latch in NAND which is directly accessible by the controller (e.g., as a peripheral). This direct access may be accomplished, for example, in response to relocating the CMOS logic in the storage device to be adjacent to the memory array (CAA) (e.g., in a circuit bounded array (CbA) architecture). For instance, the sense amplifiers and other control circuitry may be implemented in a separate CMOS chip connected to (and adjacent to) the NAND dies using via connections. Additionally, the CMOS chip may include a bus connecting the different latches, a decoder which may receive data from the data latches (e.g., encoded data stored in the memory cells of the NAND dies), decode the encoded data, and store the decoded data in the data latches, and a FIM which interfaces with the flash bus connecting the controller and the NAND dies. In such example, the decoder in the CMOS chip may be a LDPC decoder implemented in hardware, firmware/software, or a combination of hardware and firmware/software which is configured to decode sensed data in the latches and store the decoded data back in the latches, and the LDPC decoder may replace the decoder in the controller of the storage device. Similarly, the FIM in the CMOS chip may be a component, circuit, or module implemented in hardware, firmware/software, or a combination of hardware and firmware/software which is configured to transfer data between the controller and the NAND dies.

In one example of the storage device of the present disclosure, the controller may directly access or interface with the data latches in non-volatile memory. For example, the controller may provide a command or request to load data (e.g., host user data or control information) into the latches, and the controller may process the loaded data in the latches in response to the command (e.g., the controller may provide data to the host for reads, update data for writes, execute instructions in data for overlays, etc.). For instance, the processor of the controller (e.g., a Reduced Instruction Set Computer (RISC) Five (RISC-V) processor or some other processor) may schedule the controller FIM to construct and send a command to the CMOS FIM instructing the CMOS chip adjacent to the data latches to execute stored instructions in these latches (e.g., overlays or other functions sensed from memory), to load data in the latches from memory for transfer back to the processor (e.g., for host reads, overlay reads, file system reads, L2P mapping table reads, etc.), or to update and store data in the latches to memory (e.g., for host writes, file system updates, L2P mapping updates). For transferring data back to the processor, the command may instruct the CMOS chip to transfer specified byte(s) of data loaded in the latches to the controller over the flash bus, rather than the entire page or pages as in conventional implementations.

Thus, the controller may access data (e.g., control information or host user data) in the latches directly, rather than in controller RAM, thereby saving time with respect to each operation. Moreover, the amount of RAM present in the controller may not be easily exceeded, since the controller may access decoded data, metadata or other information in each of the latches of the storage device rather than the RAM. The direct latch access may also prevent the storage device from inefficiently incurring overhead due to repeated data toggling and transfers between NAND dies and controller RAM. As an example, rather than the controller undergoing a typical time-consuming process for a data relocation or metadata update including at least: 1) loading a page of control information into data latches, 2) obtaining the page of control information in controller RAM following a transfer over the flash bus connecting the controller and the non-volatile memory, 3) updating one or more bytes of the obtained control information in the controller RAM, and 4) sending the updated page of control information back from the controller RAM over the flash bus to the non-volatile memory to be stored in the latches and then the memory, here the controller of the present disclosure may skip the aforementioned data obtaining and data sending steps and instead: 1) load a page of information into the data latches, and 2) update one or more bytes of loaded control information directly in the data latches in response to a command. Thus, the controller may effectively substitute the NAND data latches for the controller RAM (e.g., access its data in data latches instead of controller RAM), thereby saving memory and time and improving storage device performance.

FIG. 1 shows an exemplary block diagram 100 of a storage device 102 which communicates with a host device 104 (also "host") according to an exemplary embodiment. The host 104 and the storage device 102 may form a system, such as a computer system (e.g., server, desktop, mobile/laptop, tablet, smartphone, etc.). The components of FIG. 1 may or may not be physically co-located. In this regard, the host 104 may be located remotely from storage device 102. Although FIG. 1 illustrates that the host 104 is shown separate from the storage device 102, the host 104 in other embodiments may be integrated into the storage device 102, in whole or in part. Alternatively, the host 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103. The at least one processor 101 may include any form of hardware capable of processing data and may include a general purpose processing unit (such as a central processing unit (CPU)), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), and any other type of non-volatile memory devices. In other examples, the host memory 103 may include volatile memory, such as random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host interface 106 is configured to interface the storage device 102 with the host 104 via a bus/network 108, and may interface using, for example, Ethernet or WiFi, or a bus standard such as Serial Advanced Technology Attachment (SATA), PCI express (PCIe), Small Computer System Interface (SCSI), or Serial Attached SCSI (SAS), among other possible candidates. Alternatively, the host interface 106 may be wireless, and may interface the storage device 102 with the host 104 using, for example, cellular communication (e.g. 5G NR, 4G LTE, 3G, 2G, GSM/UMTS, CDMA One/CDMA2000, etc.), wireless distribution methods through access points (e.g. IEEE 802.11, WiFi, HiperLAN, etc.), Infra Red (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies.

The storage device 102 includes a memory. For example, in the exemplary embodiment of FIG. 1, the storage device 102 may include a non-volatile memory (NVM) 110 for persistent storage of data received from the host 104. The NVM 110 can include, for example, flash integrated circuits, NAND memory (e.g., single-level cell (SLC) memory, multi-level cell (MLC) memory, triple-level cell (TLC) memory, quad-level cell (QLC) memory, penta-level cell (PLC) memory, or any combination thereof), or NOR memory. The NVM 110 may include a plurality of memory locations 112 which may store system data for operating the storage device 102 or user data received from the host for storage in the storage device 102. For example, the NVM may have a cross-point architecture including a 2-D NAND array of memory locations 112 having n rows and m columns, where m and n are predefined according to the size of the NVM. In the exemplary embodiment of FIG. 1, each memory location 112 may be a die 114 including multiple planes each including multiple blocks of multiple cells 116. Alternatively, each memory location 112 may be a plane including multiple blocks of the cells 116. The cells 116 may be single-level cells, multi-level cells, triple-level cells, quad-level cells, and/or penta-level cells, for example. Other examples of memory locations 112 are possible; for instance, each memory location may be a block or group of blocks. Each memory location may include one or more blocks in a 3-D NAND array. Each memory location 112 may include one or more logical blocks which are mapped to one or more physical blocks. Alternatively, the memory and each memory location may be implemented in other ways known to those skilled in the art.

The storage device 102 also includes a volatile memory 118 that can, for example, include a Dynamic Random Access Memory (DRAM) or a Static Random Access Memory (SRAM). Data stored in volatile memory 118 can include data read from the NVM 110 or data to be written to the NVM 110. In this regard, the volatile memory 118 can include a write buffer or a read buffer for temporarily storing data. While FIG. 1 illustrates the volatile memory 118 as being remote from a controller 123 of the storage device 102, the volatile memory 118 may be integrated into the controller 123.

The memory (e.g. NVM 110) is configured to store data 119 received from the host device 104. The data 119 may be stored in the cells 116 of any of the memory locations 112. As an example, FIG. 1 illustrates data 119 being stored in different memory locations 112, although the data may be stored in the same memory location. In another example, the memory locations 112 may be different dies, and the data may be stored in one or more of the different dies.

Each of the data 119 may be associated with a logical address. For example, the NVM 110 may store a logical-to-physical (L2P) mapping table 120 for the storage device 102 associating each data 119 with a logical address. The L2P mapping table 120 stores the mapping of logical addresses specified for data written from the host 104 to physical addresses in the NVM 110 indicating the location(s) where each of the data is stored. This mapping may be performed by the controller 123 of the storage device. The L2P mapping table may be a table or other data structure which includes an identifier such as a logical block address (LBA) associated with each memory location 112 in the NVM where data is stored. While FIG. 1 illustrates a single L2P mapping table 120 stored in one of the memory locations 112 of NVM to avoid unduly obscuring the concepts of FIG. 1, the L2P mapping table 120 in fact may include multiple tables stored in one or more memory locations of NVM.

Figure 2:
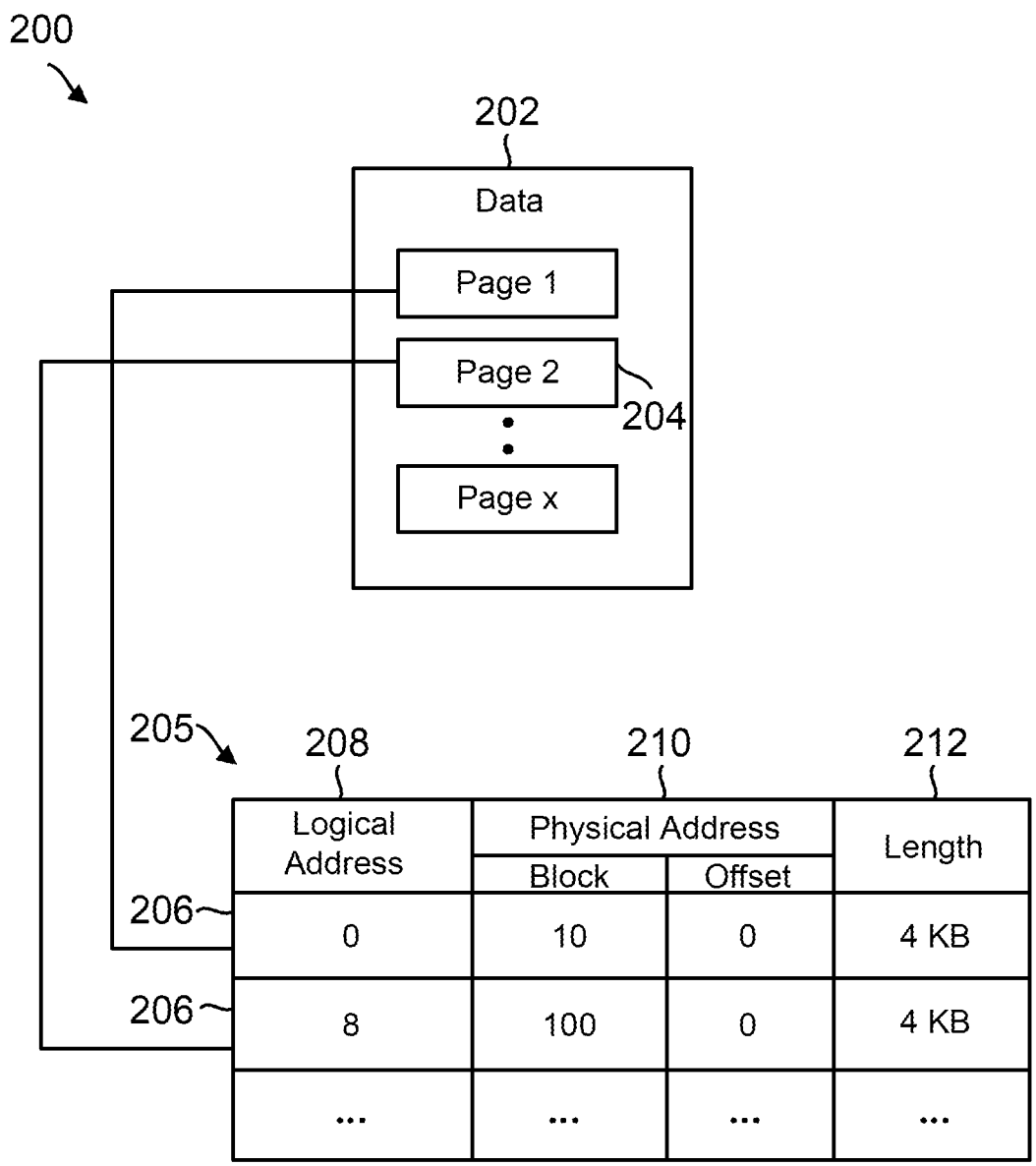
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 illustrating the mapping of data 202 received from a host device to logical addresses and physical addresses in the NVM 110 of FIG. 1. The data 202 may correspond to the data 119 in FIG. 1, while the L2P mapping table 205 may correspond to the L2P mapping table 120 in FIG. 1. In one exemplary embodiment, the data 202 may be stored in one or more pages 204, e.g., pages 1 to x, where x is the total number of pages of data being written to the NVM 110. Each page 204 may be associated with one or more entries 206 of the L2P mapping table 205 identifying a logical block address (LBA) 208, a physical address 210 associated with the data written to the NVM, and a length 212 of the data. LBA 208 may be a logical address specified in a write command for the data received from the host device. Physical address 210 may indicate the block and the offset at which the data associated with LBA 208 is physically written. Length 212 may indicate a size of the written data (e.g. 4 KB or some other size).

Referring back to FIG. 1, the volatile memory 118 also stores a cache 122 for the storage device 102. The cache 122 includes entries showing the mapping of logical addresses specified for data requested by the host 104 to physical addresses in NVM 110 indicating the location(s) where the data is stored. This mapping may be performed by the controller 123. When the controller 123 receives a read command or a write command for data 119, the controller checks the cache 122 for the logical-to-physical mapping of each data. If a mapping is not present (e.g. it is the first request for the data), the controller accesses the L2P mapping table 120 and stores the mapping in the cache 122. When the controller 123 executes the read command or write command, the controller accesses the mapping from the cache and reads the data from or writes the data to the NVM 110 at the specified physical address. The cache may be stored in the form of a table or other data structure which includes a logical address associated with each memory location 112 in NVM where data is being read.

The NVM 110 includes sense amplifiers 124 and data latches 126 connected to each memory location 112. For example, the memory location 112 may be a block including cells 116 on multiple bit lines, and the NVM 110 may include a sense amplifier 124 on each bit line. Moreover, one or more data latches 126 may be connected to the bit lines and/or sense amplifiers. The data latches may be, for example, shift registers. When data is read from the cells 116 of the memory location 112, the sense amplifiers 124 sense the data by amplifying the voltages on the bit lines to a logic level (e.g. readable as a '0' or a '1'), and the sensed data is stored in the data latches 126. The data is then transferred from the data latches 126 to the controller 123, after which the data is stored in the volatile memory 118 until it is transferred to the host device 104. When data is written to the cells 116 of the memory location 112, the controller 123 stores the programmed data in the data latches 126, and the data is subsequently transferred from the data latches 126 to the cells 116.

The storage device 102 includes a controller 123 which includes circuitry such as one or more processors for executing instructions and can include a microcontroller, a Digital Signal Processor (DSP), an Application-Specific Integrated Circuit (ASIC), a Field Programmable Gate Array (FPGA), hard-wired logic, analog circuitry and/or a combination thereof.

The controller 123 is configured to receive data transferred from one or more of the cells 116 of the various memory locations 112 in response to a read command. For example, the controller 123 may read the data 119 by activating the sense amplifiers 124 to sense the data from cells 116 into data latches 126, and the controller 123 may receive the data from the data latches 126. The controller 123 is also configured to program data into one or more of the cells 116 in response to a write command. For example, the controller 123 may write the data 119 by sending data to the data latches 126 to be programmed into the cells 116. The controller 123 is further configured to access the L2P mapping table 120 in the NVM 110 when reading or writing data to the cells 116. For example, the controller 123 may receive logical-to-physical address mappings from the NVM 110 in response to read or write commands from the host device 104, identify the physical addresses mapped to the logical addresses identified in the commands (e.g. translate the logical addresses into physical addresses), and access or store data in the cells 116 located at the mapped physical addresses.

The controller 123 and its components may be implemented with embedded software that performs the various functions of the controller described throughout this disclosure. Alternatively, software for implementing each of the aforementioned functions and components may be stored in the NVM 110 or in a memory external to the storage device 102 or host device 104, and may be accessed by the controller 123 for execution by the one or more processors of the controller 123. Alternatively, the functions and components of the controller may be implemented with hardware in the controller 123, or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The interface element 106 receives the write command, and the controller allocates a memory location 112 in the NVM 110 of storage device 102 for storing the data. The controller 123 stores the L2P mapping in the NVM (and the cache 122) to map a logical address associated with the data to the physical address of the memory location 112 allocated for the data. The controller also stores the length of the L2P mapped data. The controller 123 then stores the data in the memory location 112 by sending it to one or more data latches 126 connected to the allocated memory location, from which the data is programmed to the cells 116.

The host 104 may retrieve data from the storage device 102 by sending a read command specifying one or more logical addresses associated with the data to be retrieved from the storage device 102, as well as a length of the data to be read. The interface 106 receives the read command, and the controller 123 accesses the L2P mapping in the cache 122 or otherwise the NVM to translate the logical addresses specified in the read command to the physical addresses indicating the location of the data. The controller 123 then reads the requested data from the memory location 112 specified by the physical addresses by sensing the data using the sense amplifiers 124 and storing them in data latches 126 until the read data is returned to the host 104 via the host interface 106.

Figure 3:
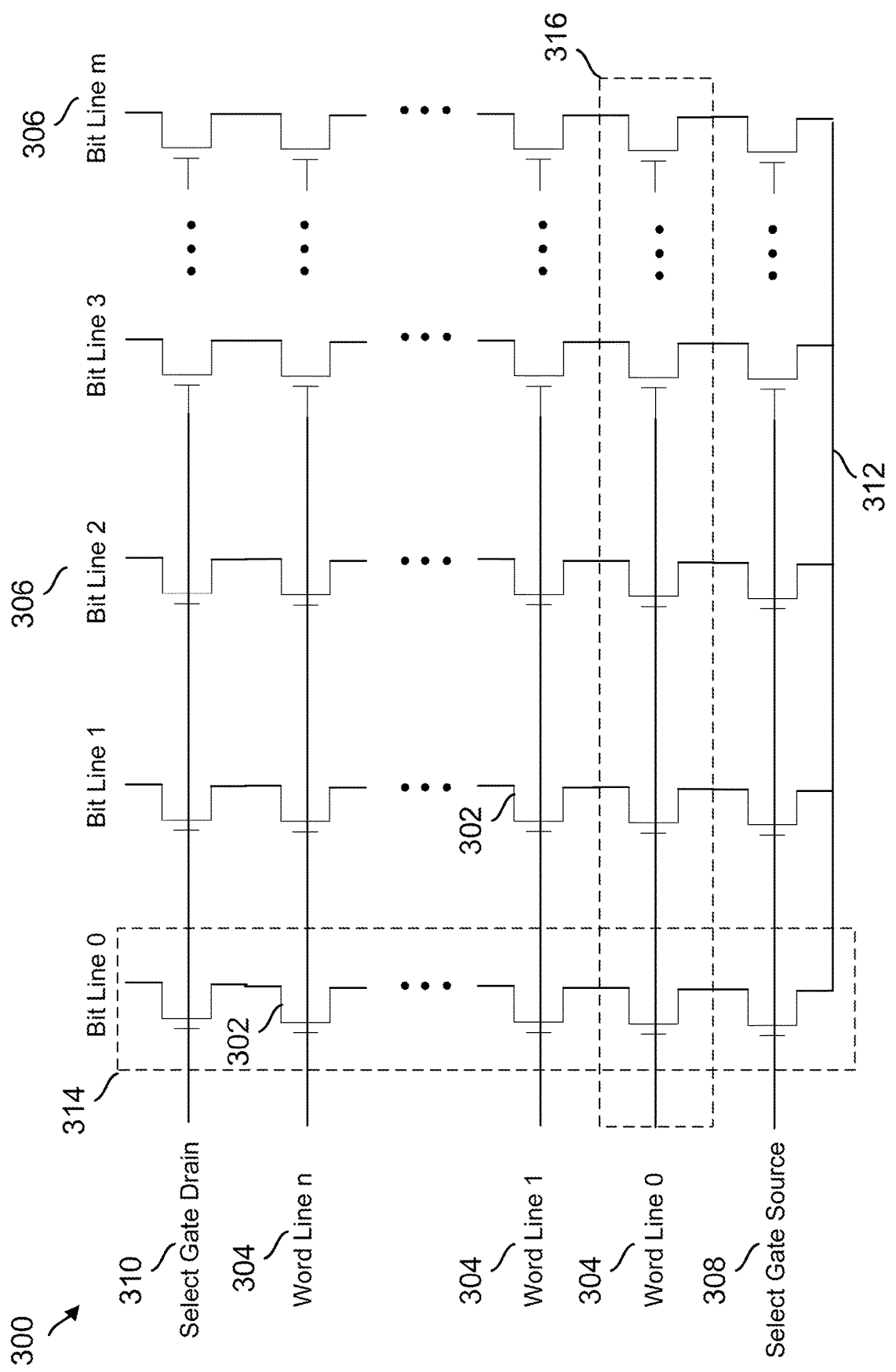
FIG. 3 is a conceptual diagram illustrating an example of an array of memory cells in the storage device of FIG. 1.

FIG. 3 illustrates an example of a NAND memory array 300 of cells 302. Cells 302 may correspond to cells 116 in the NVM 110 of FIG. 1. Multiple cells 302 are coupled to word lines 304 and bit lines 306. For example, the memory array 300 may include n word lines and m bit lines within a block of a die 114 of the NVM 110, where n and m are predefined according to the size of the block. Each word line and bit line may be respectively associated with a row and column address, which the controller 123 may use to select particular word lines and bit lines (e.g. using a row and column decoder). For example, word lines 0-n may each be associated with their own row address (e.g. word line 0 may correspond to word line address 0, word line 1 may correspond to word line address 1, etc.), and bit lines 0-m may each be associated with their own column address (e.g. bit line 0 may correspond to bit line address 0, bit line 1 may correspond to bit line address 1, etc.). Select gate source (SGS) cells 308 and select gate drain (SGD) cells 310 are coupled to the memory cells 302 on each bit line 306. The SGS cells 308 and SGD cells 310 connect the memory cells 302 to a source line 312 (e.g. ground) and bit lines 306, respectively. A string 314 may include a group of cells 302 (including SGS and SGD cells 308, 310) coupled to one bit line within a block, while a page 316 may include a group of cells 302 coupled to one word line within the block.

Figure 4:
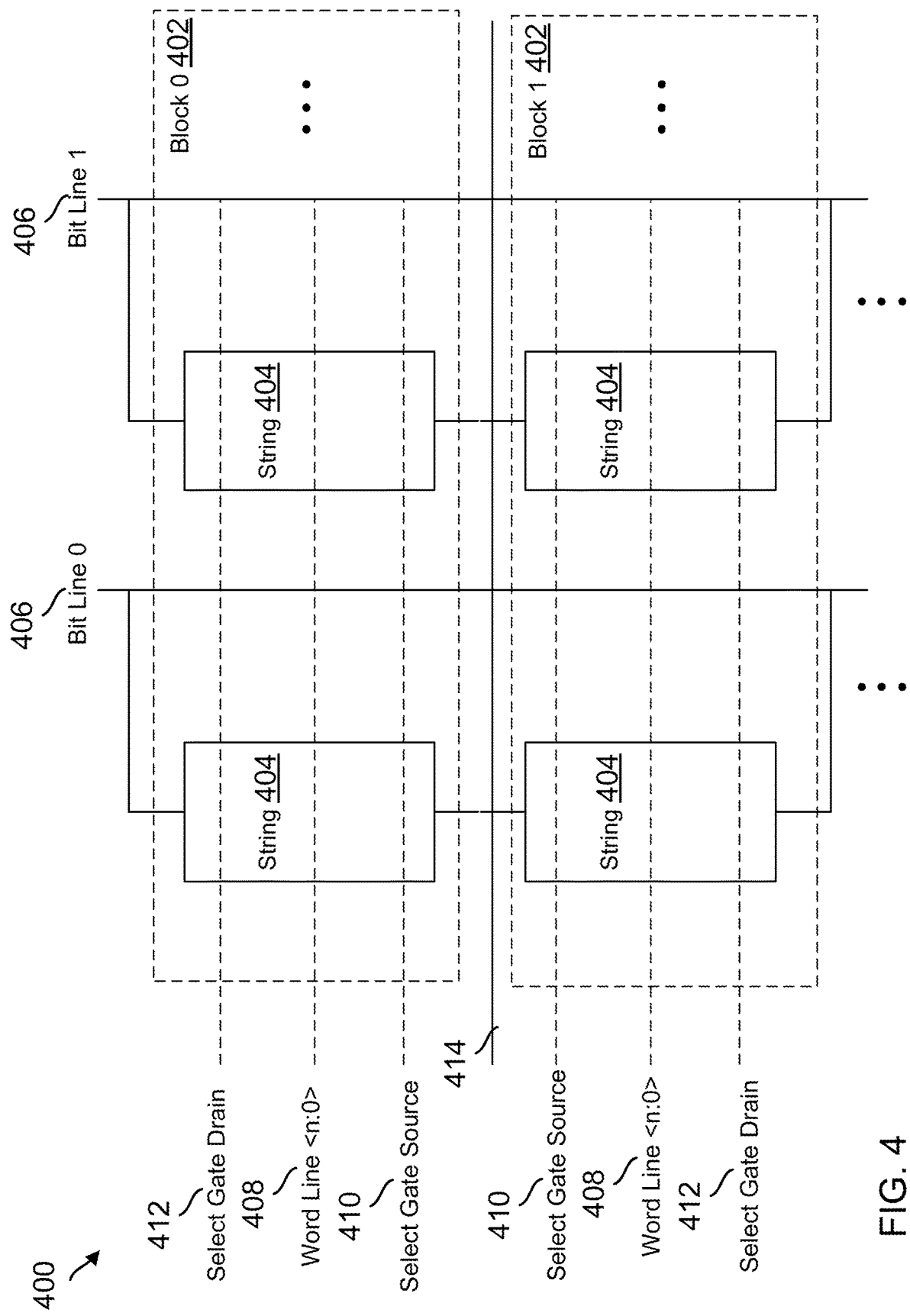
FIG. 4 is a conceptual diagram illustrating an example of an array of blocks in the storage device of FIG. 1.

FIG. 4 illustrates an example of a NAND memory array 400 of blocks 402 including multiple strings 404. Blocks 402 may correspond to blocks of a die 114 in the NVM 110 of FIG. 1, and strings 404 may each correspond to string 314 in FIG. 3. As in the memory array 300 of FIG. 3, each string 404 may include a group of memory cells each coupled to a bit line 406 and individually coupled to respective word lines 408. Similarly, each string may include a SGS cell 410 and SGD cell 412 which respectively connects the memory cells in each string 404 to a source line 414 and bit line 406.

When the controller 123 reads data from or writes data to a page 316 of cells 302 (i.e. on a word line 304, 408), the controller may send a command to apply a read voltage or program voltage to the selected word line and a pass through voltage to the other word lines. The read or programmed state of the cell (e.g. a logic '0' or a logic '1' for SLCs) may then be determined based on a threshold voltage of the cells 302. For example, during an SLC read operation, if the threshold voltage of a cell 302 is smaller than the read voltage (i.e. current flows through the cell in response to the read voltage), the controller 123 may determine that the cell stores a logic '1', while if the threshold voltage of the cell 302 is larger than the read voltage (i.e. current does not flow through the cell in response the read voltage), the controller 123 may determine that the cell stores a logic '0'. Similarly, during an SLC program operation, the controller may store a logic '0' by sending a command to apply the program voltage to the cell 302 on the word line 304, 408 until the cell reaches the threshold voltage, and during an erase operation, the controller may send a command to apply an erase voltage to the block 402 including the cells 302 (e.g. to a substrate of the cells such as a p-well) until the cells reduce back below the threshold voltage (back to logic '1').

For cells that store multiple bits (e.g. MLCs, TLCs, etc.), each word line 304, 408 may include multiple pages 316 of cells 302, and the controller may similarly send commands to apply read or program voltages to the word lines to determine the read or programmed state of the cells based on a threshold voltage of the cells. For instance, in the case of TLCs, each word line 304, 408 may include three pages 316, including a lower page (LP), a middle page (MP), and an upper page (UP), respectively corresponding to the different bits stored in the TLC. In one example, when programming TLCs, the LP may be programmed first, followed by the MP and then the UP. For example, a program voltage may be applied to the cell on the word line 304, 408 until the cell reaches a first intermediate threshold voltage corresponding to a least significant bit (LSB) of the cell. Next, the LP may be read to determine the first intermediate threshold voltage, and then a program voltage may be applied to the cell on the word line until the cell reaches a second intermediate threshold voltage corresponding to a next bit of the cell (between the LSB and the most significant bit (MSB)). Finally, the MP may be read to determine the second intermediate threshold voltage, and then a program voltage may be applied to the cell on the word line until the cell reaches the final threshold voltage corresponding to the MSB of the cell. Alternatively, in other examples, the LP, MP, and UP may be programmed together (e.g., in full sequence programming or Foggy-Fine programming), or the LP and MP may be programmed first, followed by the UP (e.g., LM-Foggy-Fine programming). Similarly, when reading TLCs, the controller 123 may read the LP to determine whether the LSB stores a logic 0 or 1 depending on the threshold voltage of the cell, the MP to determine whether the next bit stores a logic 0 or 1 depending on the threshold voltage of the cell, and the UP to determine whether the final bit stores a logic 0 or 1 depending on the threshold voltage of the cell.

Figure 5:
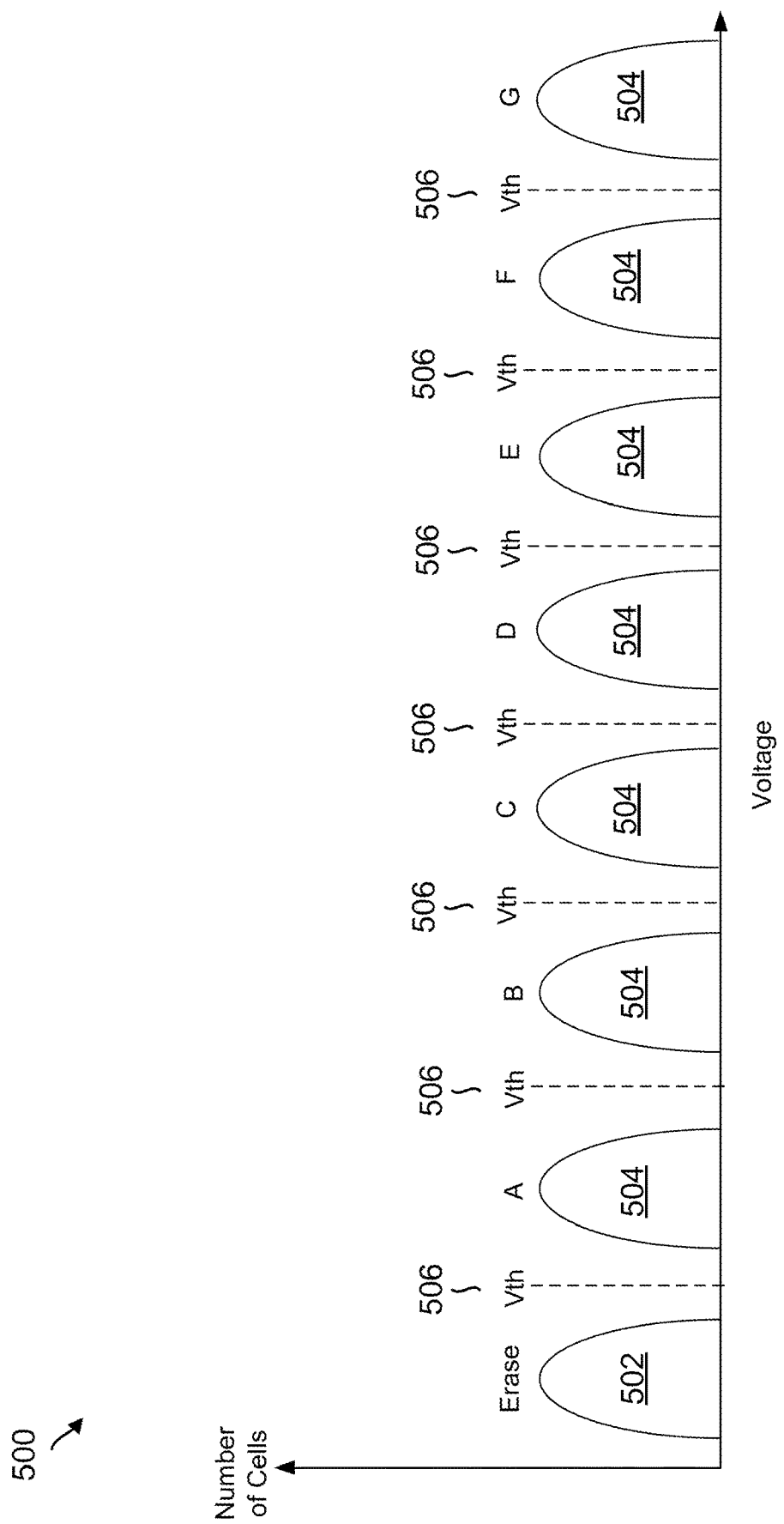
FIG. 5 is a graphical diagram illustrating an example of a voltage distribution chart for triple-level cells in the storage device of FIG. 1.

FIG. 5 illustrates an example of a voltage distribution chart 500 illustrating different NAND states for TLCs (e.g. cells 116, 302) storing three bits of data (e.g. logic 000, 001, etc. up to logic 111). The TLCs may include an erase state 502 corresponding to logic '111' and multiple program states 504 (e.g. A-G) corresponding to other logic values '000-110'. The program states 504 may be separated by different threshold voltages 506. Initially, the cells 116, 302 may be in the erase state 502, e.g. after the controller 123 erases a block 402 including the cells. When the controller 123 program LPs, MPs, and UPs as described above, the voltages of the cells 116, 302 may be increased until the threshold voltages 506 corresponding to the logic values to be stored are met, at which point the cells transition to their respective program states 504. While FIG. 5 illustrates eight NAND states for TLCs, the number of states may be different depending on the amount of data that is stored in each cell 116, 302. For example, SLCs may have two states (e.g. logic 0 and logic 1), MLCs may have four states (e.g. logic 00, 01, 10, 11), and QLCs may have sixteen states (e.g. erase and A-N).

Figure 6:
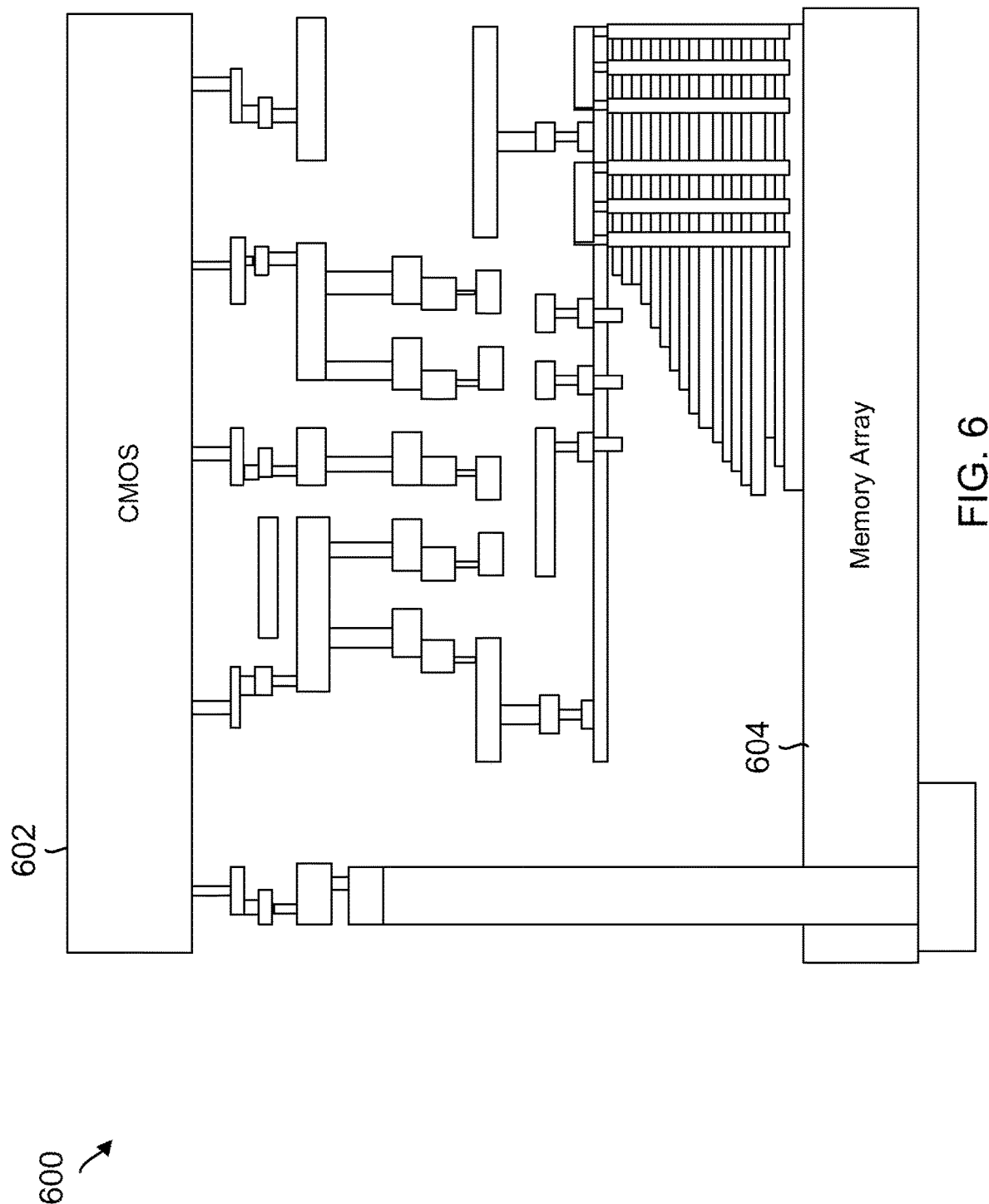
FIG. 6 is a conceptual diagram illustrating an example of a complementary metal-oxide-semiconductor (CMOS) chip adjacent to the array of blocks in the storage device of FIG. 1.

FIG. 6 illustrates an example 600 of a CMOS chip 602 adjacent to a memory array 604. The memory array 604 may include multiple dies including blocks 402 of cells 116, 302. The CMOS chip 602 may include sense amplifiers (e.g., sense amplifiers 124), column and row address decoders, and other control circuitry which may sense and program data 119 in cells 116, 302 coupled to word lines 304, 408 of blocks 402 at program states 504. The CMOS chip may also include other components such as a FIM which interfaces with controller 123 over a flash bus, and a decoder which decodes the data 119 stored in cells 116, 302. The CMOS chip 602 may be connected to memory array 604 using via connections.

Figure 7:
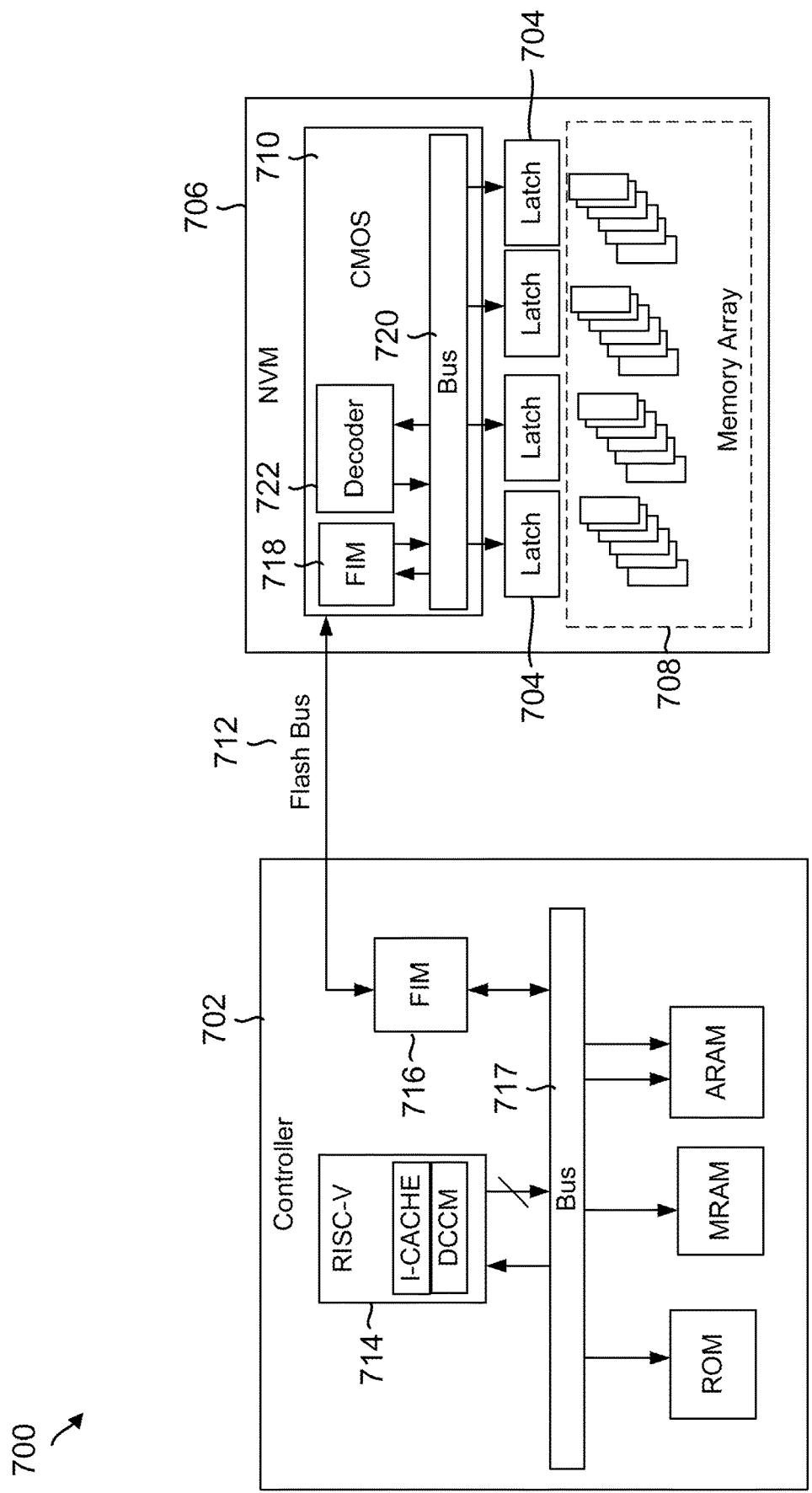
FIG. 7 is a conceptual diagram illustrating an example of a controller with direct access to data latches of a NAND die in the storage device of FIG. 1.

FIG. 7 illustrates an example 700 of a controller 702 which may directly access data in data latches 704 of a NVM 706 including a memory array 708 coupled to a CMOS chip 710. Controller 702 may correspond to controller 123, data latches may correspond to latches 126, NVM 706 may correspond to NVM 110, memory array 708 may correspond to memory array 604, and CMOS chip 710 may correspond to CMOS chip 602. Controller 702 may also be coupled to NVM 706 over a flash bus 712. Memory array 708 may include multiple dies each including multiple planes, where each plane includes multiple blocks of cells and may be coupled to one of the data latches 704. While in the illustrated example, data latches 704 are external data latches (e.g., XDL) to memory array 708, in some cases, data latches 704 may be internal data latches (e.g., ADL, BDL, CDL, etc.) to memory array 708.

Controller 702 may include a processor 714 (e.g., a RISC-V processor) and a FIM 716. Processor 714 and FIM 716 may be connected via a bus 717. Processor 714 may provide descriptors for reads, writes, or other NAND operations including logical addresses 208, physical addresses 210, data 119, and other information to FIM 716, and FIM 716 may construct and provide one or more commands to the NVM 706 over flash bus 712 including information in the descriptors. CMOS chip 710 may also include a FIM 718 which receives the command(s) from the controller over the flash bus 712, a bus 720 interconnecting the data latches 704, and control circuitry (not shown) which senses and programs data in cells of memory array 708 (e.g., through data latches 704) in response to the command(s). FIM 718 may also receive data sensed in data latches 704 over bus 720, and FIM 718 may provide the data to the controller over flash bus 712. CMOS chip 710 may also include a decoder 722 (e.g., a LDPC decoder) which receives encoded data from data latches 704, decodes the data, and stores the decoded data back in data latches 704. Controller 702 may also include various memories (e.g., controller RAM or other memory in and/or outside processor 714), such as I-CACHE, DCCM, ROM, MRAM, and ARAM illustrated in FIG. 7.

As illustrated in the example of FIG. 7, the processor 714 in controller 702 may be connected (e.g., in a MLM architecture) directly to the data latches 704 in NAND. Thus, the controller may effectively operate the latches in similar fashion to controller RAM. Moreover, due to the presence of decoder 722 in the CMOS chip 710 (adjacent to memory array 708 in a CbA architecture such as illustrated in FIG. 6), the data stored in memory array 708 may be decoded within the NAND itself. Since the data may be decoded within NVM 706, the controller may refrain from requesting internal data (e.g., metadata or control information) to be transferred from the data latches in NAND to controller 702 for decoding and processing. Instead, any internal data such as L2P table entries, overlay codes, and file system data may be read, decoded within NAND, and then executed or otherwise processed directly from the data latches 704.

In some examples, the FIM 718 may still transfer sequential data (e.g., a large amount of data) to controller 702 for processing, while overlay codes and other control information (e.g., a small amount of data, amounting to one or more bytes) may be accessed directly in the data latches 704. For instance, the FIM 716 may construct and provide one NAND command sequence (e.g., one or more commands) to NVM 706 to transfer pages of sequential data from the latches over flash bus 712 to controller RAM for processing, and a different NAND command sequence to access one or more bytes of loaded data in the latches for execution or other processing (e.g., to execute an overlay code or other instruction in the latch itself, or to update file system or L2P data in the latch itself) without transferring the data back to controller RAM. Alternatively, FIM 716 may construct and provide a NAND command sequence to load a page of data in the latches from the memory array 708, and to transfer one or more bytes of the data rather than the entire page to the controller RAM for processing (e.g., to read only a few bytes of metadata in a page).

Moreover, as illustrated in FIG. 7, the data latches 704 may all be interconnected by bus 720. Thus, any data stored in memory array 708 may be sensed in NVM 706 and decoded by decoder 722, and the controller may process any of the decoded data in data latches 704. Thus, the controller (e.g., processor 714) may directly access this data from data latches 704 without requiring the data to first be transferred from the latches over flash bus 712 to a controller RAM for processing. Moreover, the controller may access data byte-wise in the data latches 704 (e.g., one or more bytes of data in the latch, rather than the entire page). For example, the controller may update a few bytes of metadata (e.g., L2P updates) in the data latches directly and afterwards store the updated page from the latch to the memory array 708, without requiring the entire page of data in a latch to first be transferred from the latches over flash bus 712 to the controller RAM prior to the update and then transferred back over flash bus to the latches again after the update. With direct access to the data latches 704, the controller 702 may obtain one or more bytes of data in the latches over the flash bus (rather than the entire page) for processing. In either example, the execution time of NAND operations may be saved and an amount of controller RAM present may be reduced.

Figure 8:
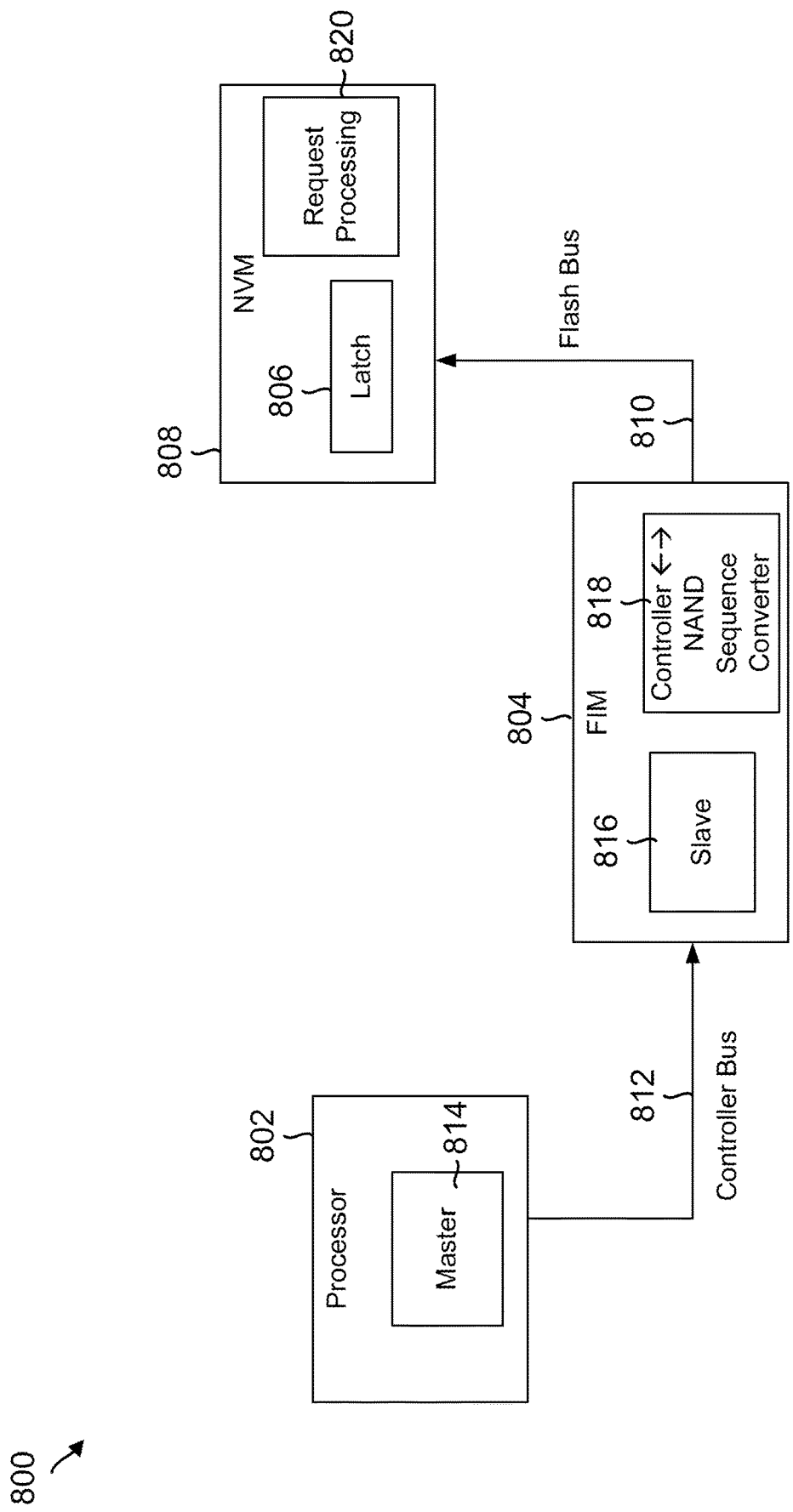
FIG. 8 is a conceptual diagram illustrating an example of a processor and flash interface module (FIM) of a controller with direct access to a data latch of a NAND die in the storage device of FIG. 1.

FIG. 8 illustrates an example 800 of a processor 802 and a FIM 804 of a controller (not shown) with direct access to a data latch 806 in NVM 808 over a flash bus 810. Processor 802 may be a general-purpose processor corresponding to processor 714, FIM 804 may correspond to FIM 716, data latch 806 may correspond to one of the data latches 704, NVM 808 may correspond to NVM 706, and flash bus 810 may correspond to flash bus 712. Processor 802 and FIM 804 may also be coupled to each other over a controller bus 812 (e.g., bus 717), which may be an advanced high performance bus (AHB), an Advanced eXtensible Interface (AXI), or some other type of bus. Processor 802 may include a master module 814 (e.g., a component, circuit, or module implemented in hardware, firmware/software, or a combination of hardware and firmware/software) which is configured to perform operations related to bus arbitration as a master for flash bus 810, and FIM 804 may include a slave module 816 (e.g., another component, circuit, or module implemented in hardware, firmware/software, or a combination of hardware and firmware/software) which is configured to perform operations related to bus arbitration as a slave for flash bus 810. FIM 804 may also include a controller-NAND sequence converter module 818 (e.g., another component, circuit, or module implemented in hardware, firmware/software, or a combination of hardware and firmware/software) which is configured to construct a NAND command sequence or request(s) for a NAND die in NVM 808 to execute (e.g., including information from descriptor(s) received from processor 802 such as previously described). Moreover, each NAND die in NVM 808 may include a request processing module 820 (e.g., another component, circuit, or module implemented in hardware, firmware/software, or a combination of hardware and firmware/software) which is configured to process the NAND command sequence or request(s) received from FIM 804 (e.g., using control circuitry in CMOS chip 710 such as previously described).

The controller (e.g., processor 802 or FIM 804) may request byte-wise access to data latch 806 (e.g., access to one or more bytes of data) for performing various operations, such as to access one or more bytes of metadata, to access firmware exception handling code (e.g., in an overlay), etc. In one example of byte-wise access, the controller may update one or more bytes of metadata or other control information directly in the data latch 806 (e.g., in response to a command provided by controller-NAND sequence converter module 818). In another example of byte-wise access, the controller may obtain one or more bytes of sensed data in the data latch over flash bus 810 (e.g., in response to another command provided by controller-NAND sequence converter module 818). In a further example of byte-wise access, the controller may execute one or more bytes of code directly in data latch 806 (e.g., an overlay) without transferring any data over flash bus 810 to the controller (e.g., in response to another command provided by controller-NAND sequence converter module 818). Other examples of byte-wise access may also be provided in response to a command provided by the controller to read, update/write, execute, or perform some other operation on data in data latch 806. In any of these examples, the full contents of data latch 806 (e.g., a page) may not be transferred and stored in controller RAM, saving time and memory in the performance of these operations.

Such byte-wise access according to the various aforementioned examples may not be allowed in conventional storage devices where the controller includes the LDPC decoder (e.g., due to CUA architectures), since in these devices the controller may be limited to page-wise access (e.g., a page at a time) from the controller RAM. For example, such controllers may not receive in controller RAM, from a data latch storing a page of data (e.g., 16 kB of data), less than the amount of that page for error correction capability (ECC) purposes, since any corrupted bits read from the NAND die 808 and transferred into controller RAM may not be correctable without the entire page for the controller to decode. However, in an example of the storage device of the present disclosure where the NAND die 808 (rather than the controller) includes the LDPC decoder (e.g., due to CAA or CbA architecture), the aforementioned page of data may be decoded, corrected with ECC, and stored back in the data latch (e.g., by request processing module 820) before the controller even accesses the data in the data latch. As a result, since the data in these latches are already decoded and if necessary, corrected, the controller may directly access this data byte-wise (e.g., one or more bytes at a time) from the data latch 806 since ECC need not again be performed. Moreover, the controller may maintain less RAM than that in conventional storage devices since the decoding and ECC has already been performed in the NAND die.

In an example of the present disclosure, byte-wise access to data latches 806 may be provided to the controller (e.g., to processor 802, FIM 804, and/or any other component, circuit, or module of the controller) in response to successful bus arbitration. For instance, in one example where the master module 814 and slave module 816 are connected together via an AHB, processor 802 may include master module 814 which intends to access data latch 806 through slave module 816 of FIM 804. Thus, master module 814 may perform bus arbitration to establish a channel with slave module 816 (e.g., via controller bus 812), and slave module 814 may establish the channel in response to determining that no operations are currently undergoing on flash bus 810 (e.g., by other processors). After establishing the channel through successful bus arbitration, the FIM 804 may obtain the descriptor or transaction from the processor 802 over controller bus 812, convert it to a NAND command sequence including an appropriate memory address (e.g., column and row) for toggling data in or out of the NAND die in NVM 808 (e.g., using controller-NAND sequence converter module 818), and provide the NAND command sequence to the NAND die over flash bus 810. The NAND die (e.g., request processing module 820) may then process the NAND command sequence by toggling data in or out of NAND die 808 in data latch 806 accordingly.

For instance, when the request processing module 820 of the NAND die in NVM 808 receives the NAND command sequence for a requested operation to toggle data in or out of the NAND die in data latch 806, the request processing module may interpret the requested operation as a byte-wise access request. For example, the command(s) may indicate the byte(s) of data to specifically be read/written (e.g., toggled). The NAND die (e.g., request processing module 820) may then fetch the logical address indicated in the payload of the command sequence for the requested NAND operation, perform an address translation of the logical address to the corresponding physical address, and then load the requested page at that physical address in the data latch 806. In the case of a read operation, the NAND die (e.g., request processing module 820) may transfer the requested byte(s) of that page to the controller over flash bus 810. In the case of a write operation, the NAND die (e.g., request processing module 820) may update and store the requested byte(s) in the page at that physical address.

Back from the controller's perspective, in the case of a read operation, after the data is toggled from NAND to data latch 806, the FIM 804 may directly obtain the data from data latch 806 (e.g., one or more bytes of the data are read as specified in the NAND command sequence) and the FIM may provide the data to processor 802 over controller bus 812. In the case of a write operation, after the data is toggled from data latch 806 to NAND (e.g., one or more bytes of the data are updated as specified in the NAND command sequence), the FIM 804 may provide an acknowledgment to the processor 802 that the transaction was successful. This process concludes an operation performed via an AHB. Similarly, in another example where the master module 814 and slave module 816 are connected together via an AXI, the process described above may be similar, except that after bus arbitration is successful, the FIM may expose an AXI port allowing streaming access to the latch context in the NAND die, and while this port is in use, the FIM prevents other accesses of flash bus 810.

In a MLM system, the controller may include multiple address models for the various memories in the MLM system (e.g., SRAM, ARAM, NAND, etc.). These address models may be one or more L2P mapping tables or entries, or other address translation tables or entries, in which the controller may track various associations of logical addresses to physical memory. For example, when the controller indicates an address for a requested page (and byte(s)) in a command to a NAND die such as previously described, the address may be one of the addresses tracked by the controller in its address translation table. Each entry corresponding to NAND memory in an address translation table may include a logical address mapped to a physical location (e.g., a specified block and word line) in a NAND die. With this address, the controller may provide a command to the NAND die to directly access control information or other data at the mapped location (e.g., a command to load a physical page at a mapped address in the data latch 806 for the controller to execute). An example of an address translation table for various memories is shown below in Table 1.

TABLE 1

| Address | Location | Translation |
|---|---|---|
| 0xF000002000 | SRAM | NA |
| 0xD000000000 | NAND | Block 10, WL 5 |
| 0xAD00000000 | ARAM | NA |
| ... | | |

The controller may maintain in controller RAM an address translation table such as shown in Table 1 indicating the physical location and/or physical address (e.g., block and word line) corresponding to a specified logical address, and the NAND die (e.g., the request processing module 820 or other component) may include control circuitry (e.g., column and row address decoders, etc.) which translate/convert the address in the command to the same word line and block in the NAND die. In some examples, the NAND die may also store the address translation table such as shown in Table 1 in the non-volatile memory as well, and the NAND die may translate/convert the indicated logical address in a NAND command based on this address translation table. For instance, the request processing module 820 may obtain the physical address in the address translation table corresponding to the indicated logical address in the NAND command prior to decoding the address using the row/column decoders to convert the address to the indicated block and word line. Thus, when the controller provides a NAND command including an address as previously described, the controller and NAND die may be in synchronization with respect to the address mapping. For example, if the controller provides the address 0xD00000000 in Table 1 within the NAND command sequence over flash bus 810 to the NAND die, the controller may ascertain that the request processing module 820 will process data at Block 10 and WL 5. The request processing module 820 may, in turn, translate the address 0xD00000000 (e.g., using the column and row decoders and/or address translation table) to the specified WL 5 of Block 10, and load/store data in that word line in the data latch 806 accordingly. Similarly, the controller may provide an address offset in the NAND command based on the address mapping. For example, if the controller provides a byte offset to address 0xD00000000 in Table 1 within the NAND command sequence over flash bus 810 to the NAND die, the controller may ascertain that the request processing module 820 will process data at the indicated word line correspondingly offset from Block 10 and WL 5. The request processing module 820 may, in turn, translate the byte offset to address 0xD00000000 (e.g., using the column and row decoders and/or address translation table) to the indicated word line correspondingly offset from WL 5 of Block 10, and load/store data in that word line in the data latch 806 accordingly.

Thus, in contrast to conventional storage devices, in some examples the storage device of the present disclosure may include direct address translations of logical addresses to specified word lines in a NAND die (e.g., in an address translation table stored in the controller and/or in the NAND die), and the controller and NAND die may maintain these translations in synchronization. This approach may save time in performance of various operations since, for example, the controller may refrain from reading an entry in a L2P mapping table in NAND for each operation since the controller already maintains a synchronized address translation table in controller RAM. As an example in the case of writing data to a NAND die, the controller may in some cases process a write command which requires execution of an overlay (e.g., some of the instructions required to perform the write are not stored in the controller RAM, but rather in the NAND die). In such case, in order to process the write command, the controller may stop performing the write operation in order to obtain the overlay, including reading the L2P mapped address of the overlay in the NAND die, then reading the overlay, and then transferring and loading the overlay into RAM. However, if the controller already maintains the physical address of the overlay in controller RAM through an address translation table such as in Table 1 above, the controller can save time in obtaining the overlay by skipping the L2P reading step and instructing the NAND die (e.g., in a command including the logical as well as physical address) to initially sense the overlay at the indicated physical address in data latch 806. Thus, after the NAND die translates the indicated address in the NAND command sequence to the corresponding physical address to sense the overlay in the corresponding block and WL (e.g., based on the logical address) and loads the overlay into the data latch 806, the controller may proceed to execute the overlay directly in the data latch 806, thereby more rapidly completing the write operation.

Accordingly, the storage device of the present disclosure may save time and memory and thus improve performance compared to conventional storage devices. For instance, in various examples, basic overlay functions may be executed from the NAND latch itself, rather than in controller RAM. In some examples, L2P operations may also be executed within the NAND latch itself, and caching of L2P pages in controller RAM may be avoided (e.g., since the controller may have byte-wise access to the data latch itself, and thus the controller can directly update the latch for programming into NAND without initially transferring the data to the controller). In further examples, header reads for internal use (e.g., reads of metadata which are stored ahead of host user data) may be performed directly in the data latch, without requiring transfers of such headers to the controller first for processing. In additional examples, various storage device applications (e.g., artificial intelligence, cloud computing, etc.) may benefit from the direct latch access provided in the MLM system of the present disclosure.

Figure 9:
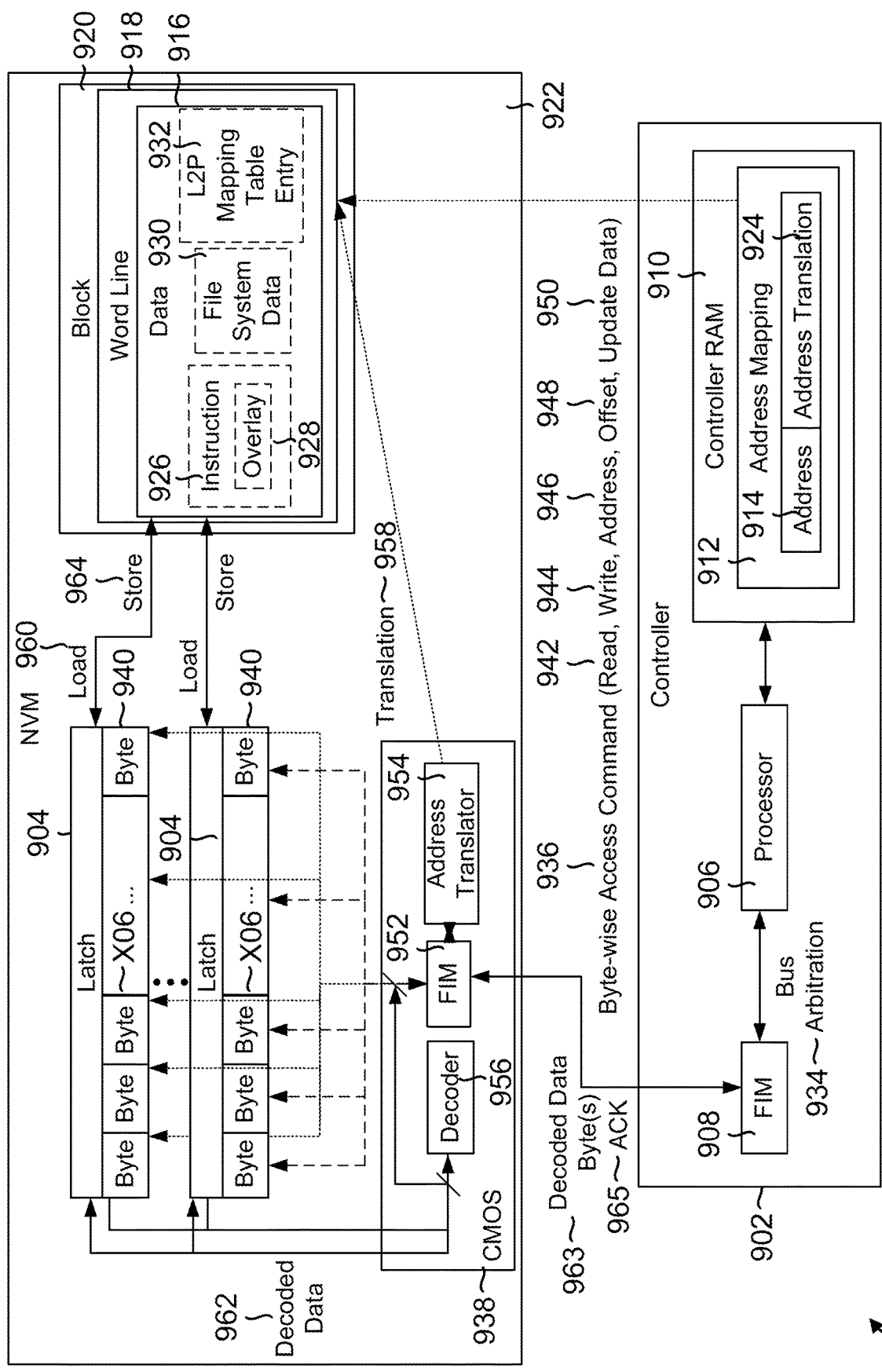
FIG. 9 is a conceptual diagram illustrating an example of a controller with byte-wise access to data latches in the storage device of FIG. 1.

FIG. 9 illustrates an example 900 of a controller 902 (corresponding to controller 123, 702) with direct, byte-wise access to data latches 904 (corresponding to data latches 126, 704, 806) in a storage device (e.g., storage device 102). Controller 902 may include a processor 906 (corresponding to processor 714, 802), a FIM 908 (corresponding to FIM 716, 804), and a controller RAM 910 (e.g., volatile memory 118, or one or more of the memories illustrated in controller 702). The controller 902 (e.g., processor 906) may also store or maintain an address mapping 912 in controller RAM 910 (e.g., a table of mapped logical or physical addresses) for data in various memories of the storage device, such as described above with respect to Table 1. For example, with respect to NAND memory, each entry in the address mapping 912 may include an address 914 (e.g., logical address 208 or physical address 210) for data 916 (e.g., data 119) in a word line 918 (e.g., word line 304, 408) of a block 920 (e.g., block 402) in NVM 922 (e.g., NVM 110, 706, 808), and an address translation 924 (e.g., a physical address, an identified block and/or word line, or other physical location identifier) indicating the word line 918 and the block 920 associated with address 914. For instance, referring to Table 1 above, an example of address 914 may be 0xD00000000, and an example of address translation 924 associated with that address may be Block 10, WL 5. Data 916 may include host user data or control information such as an instruction 926 (e.g., an overlay 928), file system data 930, or a L2P mapping entry 932 (e.g., entry 206 in L2P mapping table 120, 205).

After processor 906 and FIM 908 perform bus arbitration 934, (e.g., as described above with respect to FIG. 8), controller 902 may provide a byte-wise access command 936 to a CMOS chip 938 (e.g., CMOS chip 602, 710) in NVM 922. The byte-wise access command 936 may be, for example, a NAND command or NAND command sequence, such as described above with respect to FIG. 8, to read or write one or more bytes 940 of data 916 in one or more of the data latches 904. The byte-wise access command 936 may include one or more of a read command 942 (e.g., an indicator to CMOS chip 938 to read data 916 into one or more of data latches 904), a write command 944 (e.g., an indicator to CMOS chip 938 to write data from one or more of data latches 904), an address 946 (e.g., address 914 in address mapping 912 for data 916), an offset 948 (e.g., a byte offset to address 914 such as described above with respect to FIG. 8), and update data 950 (e.g., one or more bytes of data to replace/overwrite corresponding byte(s) of data 916 in the case of a write command).

CMOS chip 938 may include a FIM 952 (e.g., FIM 718), an address translator 954 (e.g., a component, circuit, or module implemented in hardware, firmware/software, or a combination of hardware and firmware/software), and a decoder 956 (e.g., decoder 722). In one example, the FIM 952 receives the byte-wise access command 936 from the controller 902 and may provide the address 946 in the command to address translator 954. The address translator 954 may convert the received address into address translation 958 associated with data 916 (e.g., using column and row decoders and/or a stored address mapping such as address mapping 912). In response to the byte-wise access command (e.g., a read or write), data 916 may be loaded into one or more of the data latches 904 (e.g., a load 960 of the data 916 may be performed), and this encoded data may be received from the latches in decoder 956 to be decoded into decoded data 962. Afterwards, decoded data 962 may be sent back to the data latches 904 to be stored. If the byte-wise access command is a read, requested byte(s) 940 of decoded data 962 in data latches 904 may be provided by FIM 952 back to controller 902 (e.g., as one or more decoded data bytes 963). If the byte-wise access command includes a write, one or more byte(s) 940 of the decoded data 962 in data latches 904 may be updated with update data 950 and stored in the word line 918 of the block 920 (e.g., a store 964 of the update data 950 may be performed), and an acknowledgment 965 of the update may be provided from the CMOS chip 938 to controller 902 as confirmation. If the byte-wise access command includes an execution command (e.g., if data 916 is instruction 926 to be executed such as overlay 928), the controller may process the decoded data 962 (e.g., run the instruction) directly in the one or more data latches 904. For example, if the controller 902 is performing a write operation including instructions 926 (e.g., overlay 928) stored in the NVM 922, the controller may initially perform some of the write operation instructions stored in the controller RAM 910 until the overlay 928 is next to be executed, in response to which the controller may provide byte-wise access command 936 to load the overlay into the data latches 904 and execute one or more bytes 940 of the loaded overlay in the data latches. Subsequently upon completing the overlay instructions, the controller may continue with the remainder of the write operation instructions stored in controller RAM 910 to finish the write operation. Thus, the controller 902 may directly access byte(s) 940 of data 916 in the data latches 904, for example, by sending byte-wise access command 936 to process data 916 in the data latches 904 to perform a read, write, or execution of one or more byte(s) of this data in these latches, without requiring the data to be transferred to controller RAM 910 for processing. Thus, savings in time and memory may be achieved and storage device performance may be improved.

Figure 10:
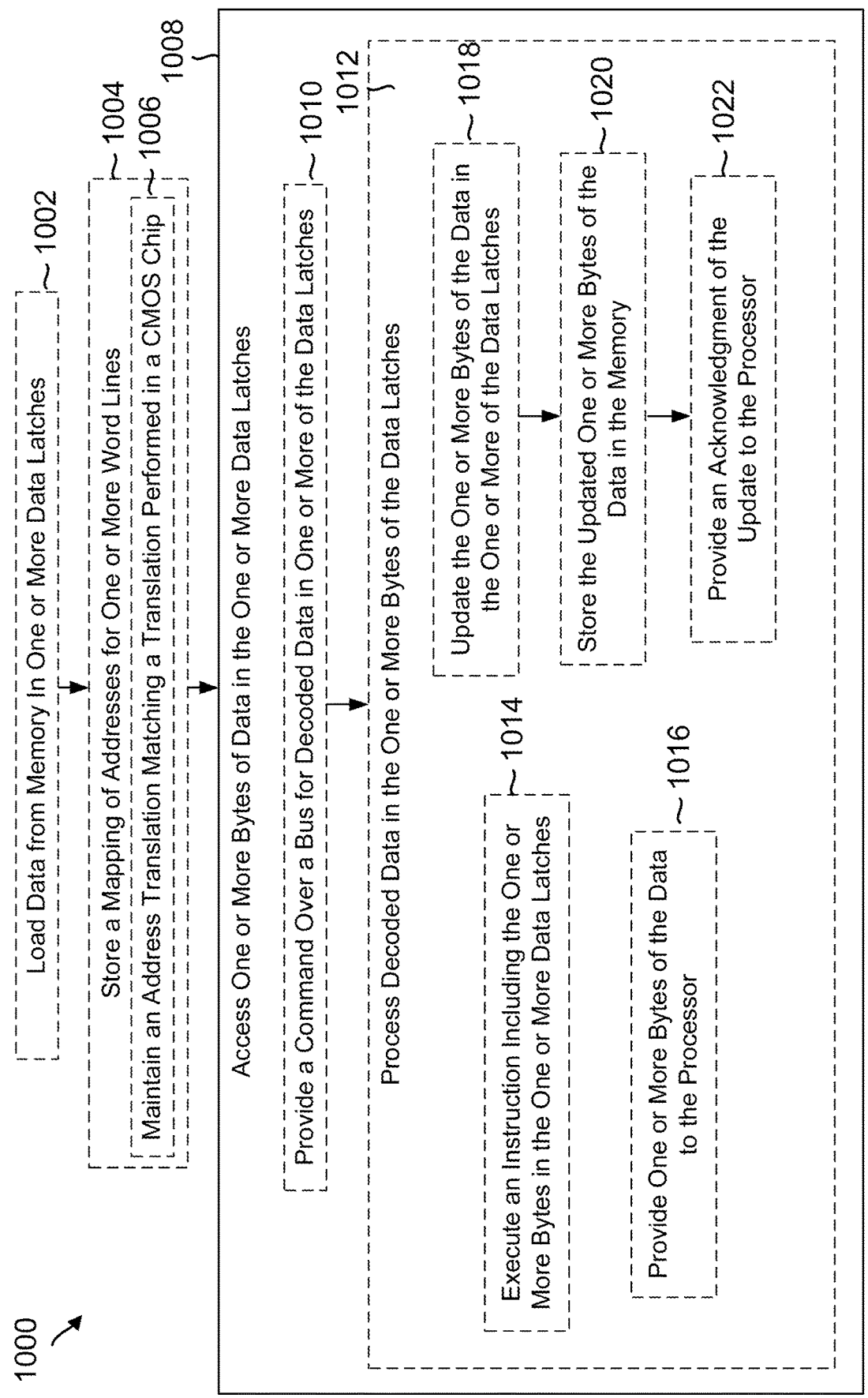
FIG. 10 is a flow chart illustrating an example of a method for directly accessing one or more bytes of data in one or more data latches connected to memory, as performed by the storage device of FIG. 1.

FIG. 10 illustrates an example flow chart 1000 of a method for directly accessing one or more bytes of data in one or more data latches connected to memory. For example, the method can be carried out in a storage device 102 such as the one illustrated in FIG. 1. Each of the steps in the flow chart can be controlled using the controller as described below (e.g. controller 123, 702, 902), by a component or module of the controller, or by some other suitable means.

As represented by block 1002, the controller 902 may load data 916 (e.g., in load 960) from a memory (e.g., memory array 604, 708 of NVM 922 including block 920 and word line 918) into one or more data latches 904 connected to the memory. The data 916 may be, for example, host user data (e.g., data 119), instruction 926 such as overlay 928, file system data 930, or L2P mapping entry 932 in L2P mapping table 120, 205.

As represented by block 1004, the memory may include a plurality of blocks (e.g., blocks 920) each including a plurality of word lines (e.g., word lines 918), and the controller 902 may store a mapping of addresses for each of the word lines (e.g., address mapping 912). For instance, as represented by block 1006, CMOS chip 938 adjacent to the memory may perform translation 958 of one of the addresses 914, 946, and the controller may maintain address translation 924 matching the translation 958 performed in the CMOS chip 938. The address translation 924 may include an identifier of one of the blocks 920 and an identifier of one of the word lines 918 in the one of the blocks. Similarly, the CMOS chip may perform translation 958 of offset 948 to the one of the addresses 946.

In one example, the CMOS chip 938 may include bus 720 interconnecting the data latches 904. In another example, the CMOS chip 938 (e.g., the decoder 956 in CMOS chip 938) may decode the data 916 in the one or more of the data latches 904 and may store decoded data 962 in the one or more of the data latches 904.

As represented by block 1008, the controller 902 may access one or more bytes 940 of data 916 (e.g., the decoded data 962) in the one or more of the data latches 904. For instance, the controller 902 may include processor 906 and FIM 908 coupled to the processor 906, and the FIM 908 may access one or more bytes 940 of the decoded data 962 in the one or more of the data latches 904. In one example, the FIM 908 may be coupled to the data latches over flash bus 712, and the FIM 908 may access the one or more bytes 940 of the decoded data 962 in response to bus arbitration 934.

To access the one or more bytes 940 of data 916 at block 1008, for example, the controller 902 may perform the steps represented at blocks 1010 and 1012. For instance, as represented by block 1010, the controller 902 (e.g., the FIM 908) may provide a command (e.g., byte-wise access command 936) over the flash bus 712 for the one or more bytes 940 of the decoded data 962, and as represented by block 1012, the controller 902 (e.g., the FIM 908) may process the one or more bytes 940 of the decoded data 962 in at least one of the data latches 904 in response to the command 936. For example, the controller 902 may process the one or more bytes 940 of data in the at least one of the data latches 904 in response to the translation 958 of the address 914 or offset 948 performed by the CMOS chip 938.

In one example of the processing at block 1012, as represented by block 1014, the controller 902 may execute instruction 926 including the one or more bytes 940 of the one or more of the data latches 904. In another example of the processing at block 1012, as represented by block 1016 and in response to the command 936 being read command 942, the controller 902 (e.g., the FIM 908) may provide the one or more bytes 940 of the decoded data 962 in the one or more data latches 904 to the processor 906. In another example of the processing at block 1012, as represented by block 1018 and in response to the command 936 being write command 944, the controller 902 (e.g., the FIM 908) may update the one or more bytes 940 of the decoded data 962 in the one or more data latches 904, as represented by block 1020, the controller 902 (e.g., the FIM 908) may store the one or more bytes 940 of updated data 950 in the memory (e.g., in word line 918 of block 920 after re-encoding the data), and as represented by block 1022, the controller 902 (e.g., the FIM 908) may provide acknowledgement 965 of the update (e.g., the store 964) to the processor 906.

Figure 11:
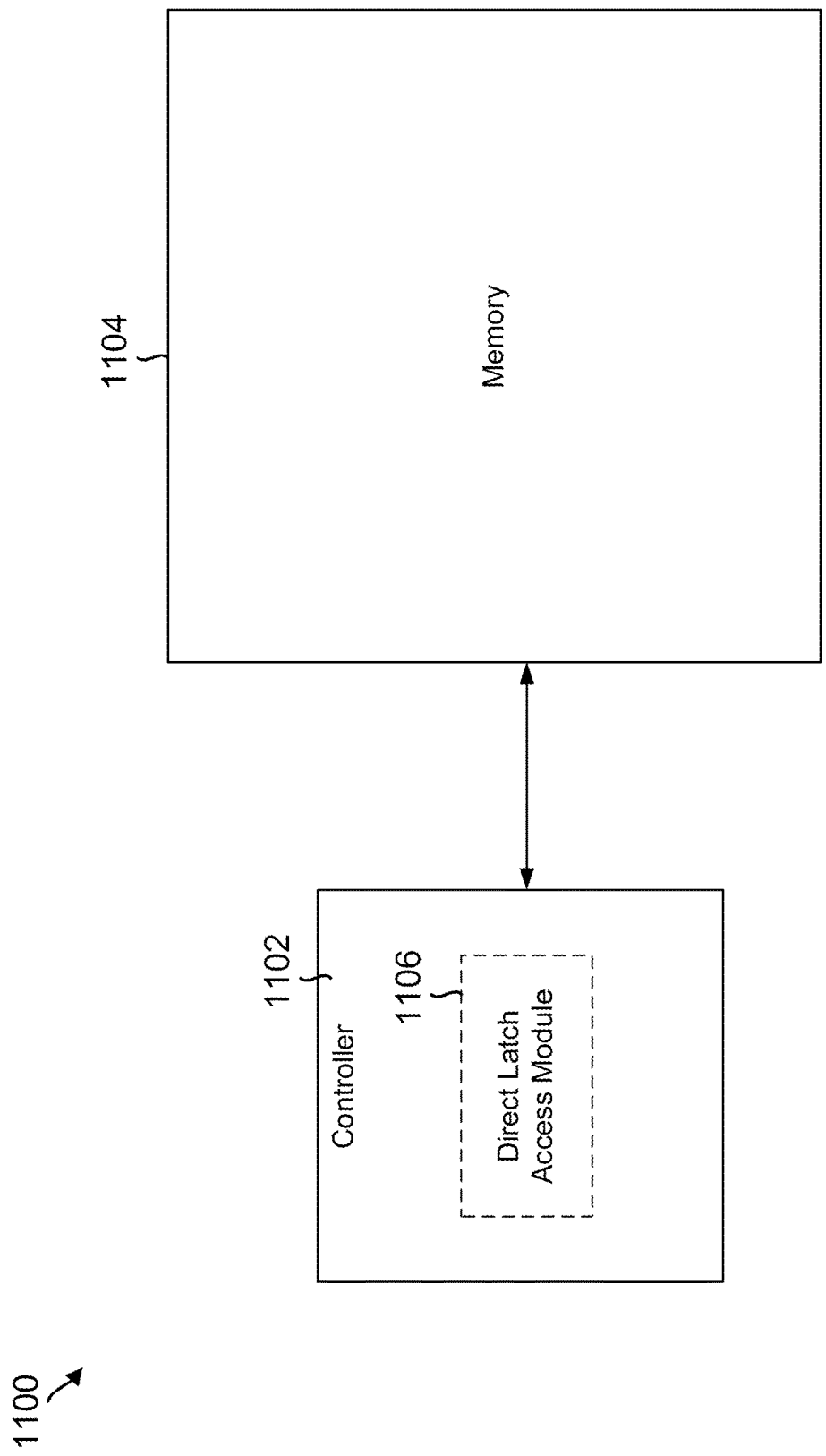
FIG. 11 is a conceptual diagram illustrating an example of a controller that directly accesses one or more bytes of data in one or more data latches connected to memory in the storage device of FIG. 1.

FIG. 11 is a conceptual diagram illustrating an example 1100 of a controller 1102 coupled to a memory 1104 in a storage device. For example, controller 1102 may correspond to controller 123, 702, 902 and memory 1104 may correspond to the NVM 110, 706, 808, 922 of the storage device 102 in FIG. 1. The controller may be implemented in software, hardware, or a combination of hardware and software. In one exemplary embodiment, the controller is implemented with several software modules executed on one or more processors, but as those skilled in the art will appreciate, the controller may be implemented in different ways. The skilled artisan will readily understand how best to implement the controller based on the particular design parameters of the system.

In one example, the controller 1102 includes a direct latch access module 1106 that may provide a means for accessing one or more bytes of data in one or more of the data latches. For example, the direct latch access module 1106 may perform the process or algorithm described above with respect to FIG. 11 at block 1008.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. A storage device, comprising:
    a memory;
    a plurality of data latches connected to the memory;
    a complementary metal-oxide-semiconductor (CMOS) chip adjacent to the memory; and
    a controller coupled to each of the data latches, wherein the CMOS chip is configured to decode data in one or more of the data latches and to store decoded data in the one or more of the data latches, and the controller is configured to access a byte of the decoded data in the one or more of the data latches.

2. The storage device of claim 1, wherein the controller is configured to execute an instruction including the byte of the decoded data in the one or more of the data latches.

3. The storage device of claim 1, wherein the controller is configured to load the data from the memory in the one or more of the data latches prior to accessing the byte of the decoded data.

4. The storage device of claim 3, wherein the data is an overlay, file system data, or an entry in a logical-to-physical (L2P) mapping table.

5. The storage device of claim 1, wherein the controller is configured to update the byte of the decoded data in the one or more of the data latches, and to store the updated byte of the decoded data in the memory.

6. The storage device of claim 1,
    wherein the CMOS chip includes a bus interconnecting the data latches.

7. A storage device, comprising:
    a memory;
    a plurality of data latches connected to the memory;
    a complementary metal-oxide-semiconductor (CMOS) chip adjacent to the memory, the CMOS chip including a bus interconnecting the data latches; and
    a controller coupled to each of the data latches, wherein the CMOS chip is configured to decode data in one or more of the data latches and to store decoded data in the one or more of the data latches, and the controller is configured to access the decoded data in the one or more of the data latches.

8. The storage device of claim 7, wherein the controller is configured to process one or more bytes of the decoded data in the one or more of the data latches.

9. The storage device of claim 7, wherein the controller includes a processor and a flash interface module (FIM) coupled to the processor, and the FIM is configured to access one or more bytes of the decoded data in the one or more of the data latches.

10. The storage device of claim 9, wherein the FIM is coupled to the data latches over a bus, and the FIM is configured to access the one or more bytes of the decoded data in response to a bus arbitration.

11. The storage device of claim 9, wherein the FIM is coupled to the data latches over a bus, the FIM is configured to provide a command over the bus for the decoded data, and the FIM is configured to process the one or more bytes of the decoded data in response to the command.

12. The storage device of claim 11, wherein the FIM is configured to provide the one or more bytes of the decoded data to the processor in response to the command being a read command.

13. The storage device of claim 11, wherein the FIM is configured to update the one or more bytes of the decoded data in response to the command being a write command, and to provide an acknowledgment of the update to the processor.

14. A storage device, comprising:
    a memory including a plurality of blocks, each of the blocks including a plurality of word lines;
    a plurality of data latches connected to the memory; and
    a controller coupled to each of the data latches, wherein the controller is configured to store a mapping of addresses for each of the word lines, to provide a command including one of the addresses for data in the memory, and to process a byte of the data in at least one of the data latches in response to the command.

15. The storage device of claim 14, further comprising:
    a complementary metal-oxide-semiconductor (CMOS) chip adjacent to the memory, wherein the CMOS chip is configured to perform a translation of the one of the addresses, and the controller is further configured to process the byte of the data in the at least one of the data latches in response to the translation.

16. The storage device of claim 15, wherein the controller is configured to maintain an address translation matching the translation performed in the CMOS chip.

17. The storage device of claim 16, wherein the address translation includes one of the blocks and one of the word lines in the one of the blocks.

18. The storage device of claim 14, further comprising:
    a complementary metal-oxide-semiconductor (CMOS) chip adjacent to the memory, wherein the command includes an offset to the one of the addresses, the CMOS chip is configured to perform a translation of the offset, and the controller is configured to process the byte of the data in response to the translation.

19. The storage device of claim 14, wherein the controller includes a processor and a flash interface module (FIM) coupled to the processor, the FIM is coupled to the data latches over a bus, and the FIM is configured to provide the byte of the data in the at least one of the data latches to the processor in response to the command.

* * * * *